United States Patent
Sun et al.

(10) Patent No.: US 7,790,546 B2
(45) Date of Patent: Sep. 7, 2010

(54) METHOD FOR FORMING STORAGE NODE OF CAPACITOR IN SEMICONDUCTOR DEVICE

(75) Inventors: Jun-Hyeub Sun, Ichon-shi (KR); Sung-Kwon Lee, Ichon-shi (KR); Sung-Yoon Cho, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 114 days.

(21) Appl. No.: 12/168,823

(22) Filed: Jul. 7, 2008

(65) Prior Publication Data

US 2008/0293212 A1  Nov. 27, 2008

Related U.S. Application Data

(63) Continuation of application No. 11/204,660, filed on Aug. 15, 2005, now Pat. No. 7,410,866.

(30) Foreign Application Priority Data

Dec. 20, 2004 (KR) ............... 10-2004-0108694
Dec. 22, 2004 (KR) ............... 10-2004-0110083
Dec. 27, 2004 (KR) ............... 10-2004-0112821

(51) Int. Cl.
*H01L 21/8242* (2006.01)

(52) U.S. Cl. .................. 438/254; 257/E21.018

(58) Field of Classification Search ......... 438/396, 438/254, 239, 243
See application file for complete search history.

(56) References Cited

U.S. PATENT DOCUMENTS

| 5,346,844 A | 9/1994 | Cho et al. |
| 6,548,853 B1 | 4/2003 | Hwang et al. |
| 6,563,161 B2 | 5/2003 | Sheu et al. |
| 6,867,095 B2 | 3/2005 | Park |
| 7,122,467 B2 | 10/2006 | Lee et al. |
| 7,138,675 B2 | 11/2006 | Lee et al. |
| 2001/0045587 A1 | 11/2001 | Hosotani et al. |
| 2002/0113237 A1 | 8/2002 | Kitamura |
| 2003/0162353 A1* | 8/2003 | Park ..................... 438/253 |
| 2004/0140486 A1* | 7/2004 | Lee et al. .............. 257/208 |
| 2004/0224454 A1* | 11/2004 | Jin et al. .............. 438/199 |

(Continued)

FOREIGN PATENT DOCUMENTS

KR  10-2001-0039179 A  5/2001

(Continued)

*Primary Examiner*—Thao Le
(74) *Attorney, Agent, or Firm*—Townsend and Townsend and Crew LLP

(57) ABSTRACT

A method for forming a capacitor in a semiconductor device comprises forming an inter-layer layer on a semi-finished substrate; etching the inter-layer insulation layer to form a plurality of first contact holes; forming a first insulation layer on sidewalls of the first contact holes; forming a plurality of storage-node contact plugs filled into the first contact holes; forming a second insulation layer with a different etch rate from the first insulation layer over the storage-node contact plugs; forming a third insulation layer on the second insulation layer; sequentially etching the third insulation layer and the second insulation layer to form a plurality of second contact holes exposing the storage-node contact plugs; and forming the storage node on each of the second contact holes.

22 Claims, 20 Drawing Sheets

U.S. PATENT DOCUMENTS

| | | | |
|---|---|---|---|
| 2004/0253811 A1* | 12/2004 | Lee et al. | 438/633 |
| 2005/0026420 A1* | 2/2005 | Han et al. | 438/622 |
| 2005/0118779 A1* | 6/2005 | Ahn | 438/396 |

FOREIGN PATENT DOCUMENTS

| | | |
|---|---|---|
| KR | 10-2001-0051294 A | 6/2001 |
| KR | 10-2002-0043905 A | 6/2002 |
| KR | 10-2003-0050052 A | 6/2003 |
| KR | 10-2003-0093436 A | 12/2003 |
| KR | 10-0656283 B1 | 12/2006 |

* cited by examiner

METHOD FOR FORMING STORAGE NODE OF CAPACITOR IN SEMICONDUCTOR DEVICE

CROSS-REFERENCES TO RELATED APPLICATIONS

This application is a continuation of U.S. patent application Ser. No. 11/204,660, filed on Aug. 15, 2005 (now allowed); now U.S. Pat. No. 7,410,866 which claims priority to Korean Patent Application No. 10-2004-0108694, filed on Dec. 20, 2004; Korean Patent Application No. 10-2004-0110083, filed on Dec. 22, 2004; and Korean Patent Application No. 10-2004-011281, filed on Dec. 27, 2004; all of which are incorporated herein by reference.

BACKGROUND OF THE INVENTION

The present invention relates to a method for forming a storage node of a capacitor in a semiconductor device; and, more particularly, to a method for forming a storage node of a capacitor in a dynamic random access memory device.

As semiconductor devices have become highly integrated, the overall unit cell size has gradually decreased. For example, in a dynamic random access memory (DRAM) device, the unit cell comprises one transistor and one capacitor. Thus, as the integration scale of semiconductor devices has increased, it has become more difficult to control related processes.

FIGS. 1A to 1C relate to a method for forming a storage node of a capacitor in a DRAM device.

Referring to FIG. 1A, an inter-layer insulation layer 11 is formed on a substrate 10, where the inter-layer insulation layer 11 is patterned through a photolithography process to form a plurality of contact holes (not shown). An insulation layer and a polysilicon layer are sequentially formed inside each contact hole, and a chemical mechanical polishing (CMP) process is performed on the polysilicon layer and the insulation layer, thereby forming spacers 12 on sidewalls of the contact holes and a plurality of storage-node contact plugs 13 filled into the contact holes. A nitride layer 14, an oxide layer 15 and a hard mask layer 16 are sequentially formed on the above resulting substrate structure.

Referring to FIG. 1B, although not illustrated, a photoresist layer is formed on the hard mask layer 16, and a photo-exposure and developing process is performed with use of a mask, thereby forming a photoresist pattern. Then, the hard mask layer 16 is etched by using the photoresist pattern as an etch mask. After the etching of the hard mask layer 16, a hard mask pattern 16A is formed. The oxide layer 15 is then etched by using the hard mask pattern 16A as an etch barrier and this etching is stopped at the nitride layer 14. It should be appreciated that the nitride layer 14 acts as an etch stop layer. After the etching of the oxide layer 15, a plurality of first contact holes 17 exposing the nitride layer 14 are formed.

Referring to FIG. 1C, the nitride layer 14 is etched to form a plurality of second contact holes 17A exposing the storage-node contact plugs 13. Although not illustrated, a storage node layer, a dielectric layer and an upper electrode layer are sequentially formed over the second contact holes 17A and then, a CMP process is performed thereon, thereby forming capacitors.

However, as shown in FIG. 1C, there may be an incidence of misalignment between the second contact holes 17A and the storage-node contact plugs 13. Thus, when the nitride layer 14 is etched, the spacers 12 are also etched, thereby generating crevices A at sidewalls of the inter-layer insulation layer 11. Afterwards, when the storage node layer, the dielectric layer and the upper electrode layer are formed, a step coverage characteristic of the storage node layer becomes poor at the regions where the crevices A are generated. Therefore, leakage current of the capacitors increases, thereby causing defects in semiconductor devices.

BRIEF SUMMARY OF THE INVENTION

The present invention relates to a method for forming a storage node of a capacitor in a semiconductor device capable of preventing degradation of a device characteristic through improving a step-coverage characteristic of the storage node, which may be deteriorated as spacers serving as a barrier for a storage-node contact plug are damaged.

In accordance with an embodiment of the present invention, a method for forming a storage node of a capacitor in a semiconductor device is provided, wherein the method comprises: forming an inter-layer layer on a substrate; etching the inter-layer insulation layer to form a plurality of first contact holes; forming a first insulation layer on sidewalls of the first contact holes; forming a plurality of storage-node contact plugs filled into the first contact holes; forming a second insulation layer with a different etch rate from the first insulation layer over the storage-node contact plugs; forming a third insulation layer on the second insulation layer; sequentially etching the third insulation layer and the second insulation layer to form a plurality of second contact holes exposing the storage-node contact plugs; and forming the storage node on each of the second contact holes.

In accordance with another embodiment of the present invention, a method for forming a storage node of a capacitor in a semiconductor device is provided, wherein the method comprises: sequentially forming a first insulation layer and a second insulation layer each with a different etch rate on a substrate; forming a plurality of first contact holes passing through the first and the second insulation layers; forming spacers with the same etch rate of the second insulation layer on sidewalls of the first contact holes; forming a plurality of storage-node contact plugs filled into the first contact holes; forming an etch stop layer with the same etch rate of the second insulation layer over the storage-node contact plugs; forming a sacrificial oxide layer on the etch stop layer; sequentially etching the sacrificial oxide layer and the etch stop layer to form a plurality of second contact holes exposing the storage-node contact plugs; and forming the storage node on each of the second contact holes.

In accordance with still another embodiment of the present invention, a method for forming a storage node of a capacitor in a semiconductor device is provided, wherein the method comprises: forming a first insulation layer on a substrate; forming a plurality of first contact holes passing through the first insulation layer; forming spacers with a different etch rate from the first insulation layer on sidewalls of the first contact holes; forming a plurality of storage-node contact plugs filled into the first contact holes; forming an etch stop layer with the same etch rate of the spacers over the storage-node contact plugs; forming a sacrificial oxide layer on the etch stop layer; sequentially etching the sacrificial oxide layer and the etch stop layer under an etch recipe of oxide etching, thereby forming a plurality of second contact holes exposing the storage node contact holes; and forming the storage node on each of the second contact holes.

In accordance with still another embodiment of the present invention, a method for forming a storage node of a capacitor in a semiconductor device is provided, wherein the method comprises: forming a first insulation layer on a substrate;

forming a plurality of first contact holes passing through the first insulation layer; forming spacers with a different etch rate from the first insulation layer on sidewalls of the first contact holes; forming a plurality of storage-node contact plugs such that the storage-node contact plugs are filled into the first contact holes and of which height is higher than the spacers; forming a second insulation layer with the same etch rate of the first insulation layer over the storage-node contact plugs; planarizing the second insulation layer at the same level of the storage-node contact plugs; forming an etch stop layer with the same etch rate of the spacers over the storage-node contact plugs; forming a sacrificial oxide layer on the etch stop layer; performing an etching process that provides a low etch selectivity of the spacers with respect to the storage-node contact plugs to form a plurality of second contact holes exposing the storage-node contact plugs; and forming the storage node on each of the second contact holes.

In accordance with yet another embodiment of the present invention, a method for forming a storage node of a capacitor in a semiconductor device is provided, wherein the method comprises: forming an inter-layer insulation layer on a substrate; etching the inter-layer insulation layer to form a plurality of first contact holes; forming spacers on sidewalls of the first contact holes; forming storage-node contact plugs filled into the first contact holes; forming an etch stop layer over the storage-node contact plugs; forming a nitride layer on the etch stop layer; etching the nitride layer and the etch stop layer to form a plurality of second contact holes exposing the storage-node contact plugs; selectively recessing predetermined portions of the inter-layer insulation layer exposed through the second contact holes by using a different etch selectivity between the inter-layer insulation layer and the spacers; and forming the storage node on each of the second contact holes.

Thus, certain embodiments of the present invention relate to improving the step-coverage characteristic of capacitors formed over a substrate. Some of these embodiments relate to forming capacitors within a dynamic random access memory (DRAM) device. A further understanding of the embodiments of the present invention can be made by way of reference to the ensuing detailed description taken in conjunction with the accompanying drawings.

BRIEF DESCRIPTION OF THE DRAWINGS

The above and other features of the present invention will become better understood with respect to the following description of the embodiments given in conjunction with the accompanying drawings, in which.

DETAILED DESCRIPTION OF THE INVENTION

A method for forming a storage node of a capacitor in a semiconductor device in accordance with embodiments of the present invention will be described in detail with reference to the accompanying drawings.

FIGS. 2A to 2E are cross-sectional views illustrating a method for forming a storage node of a capacitor in a semiconductor device in accordance with a first embodiment of the present invention.

Figure 1A:
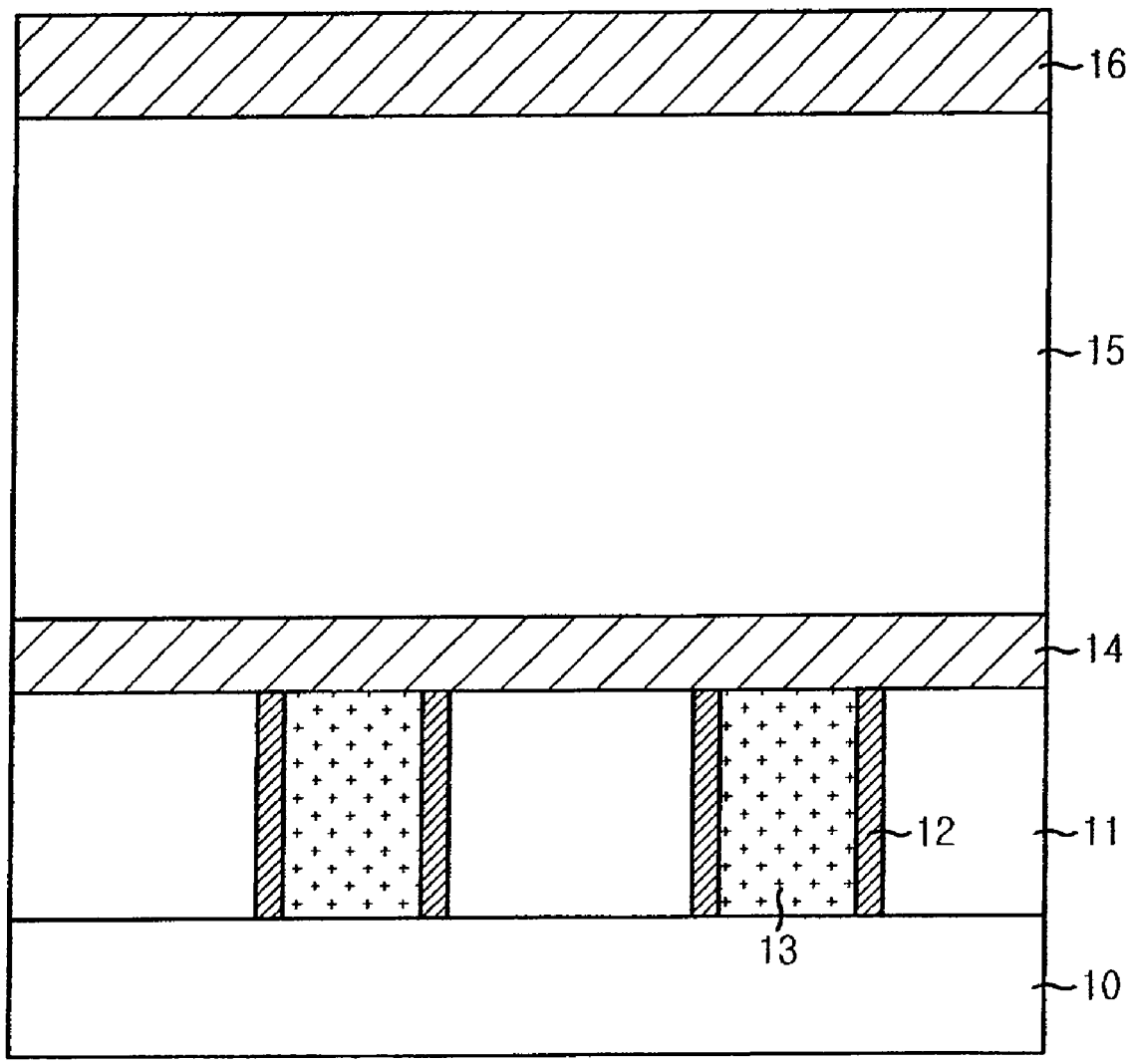
FIGS. 1A to 1C are cross-sectional views illustrating a conventional method for forming a storage node of a capacitor in a semiconductor device.
Figure 1B:
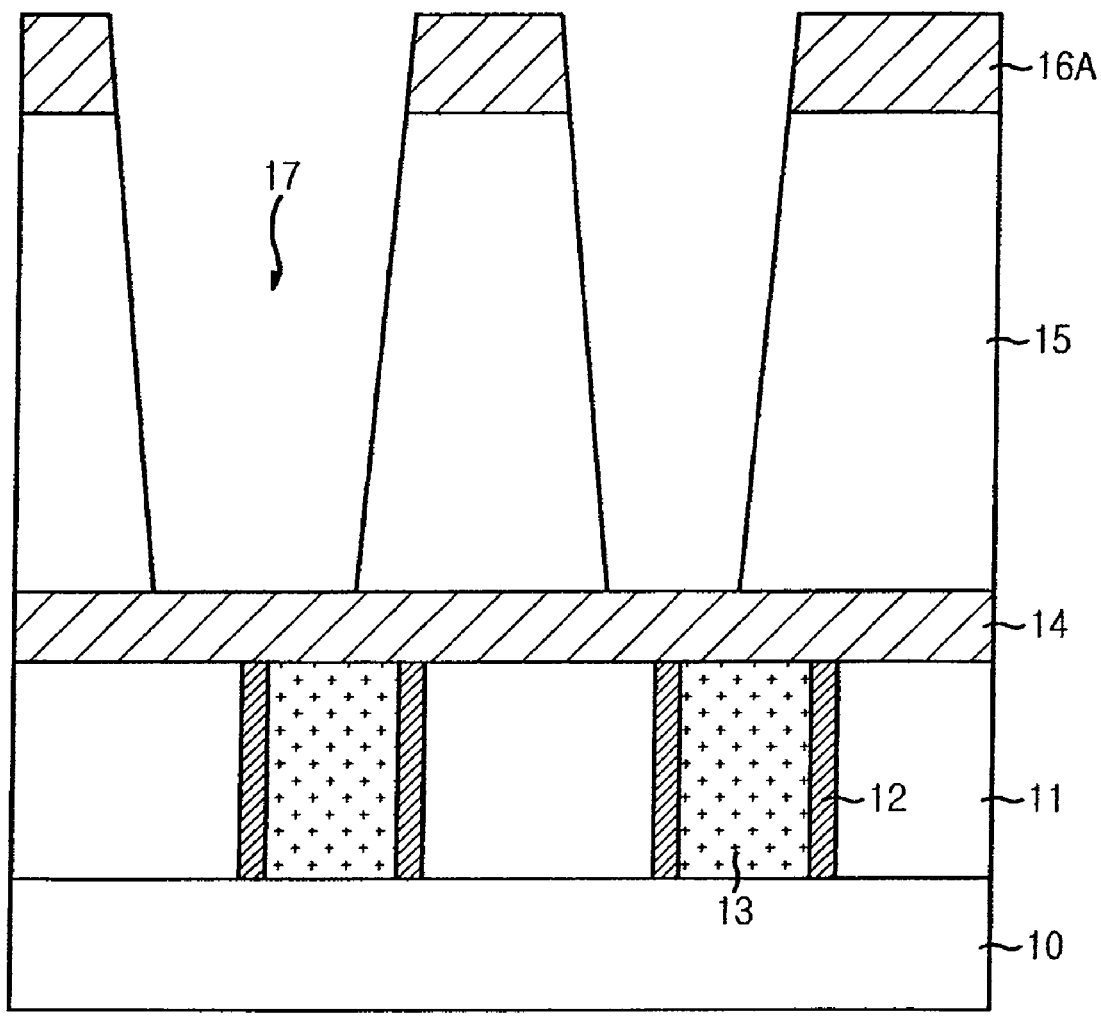
Figure 1C:
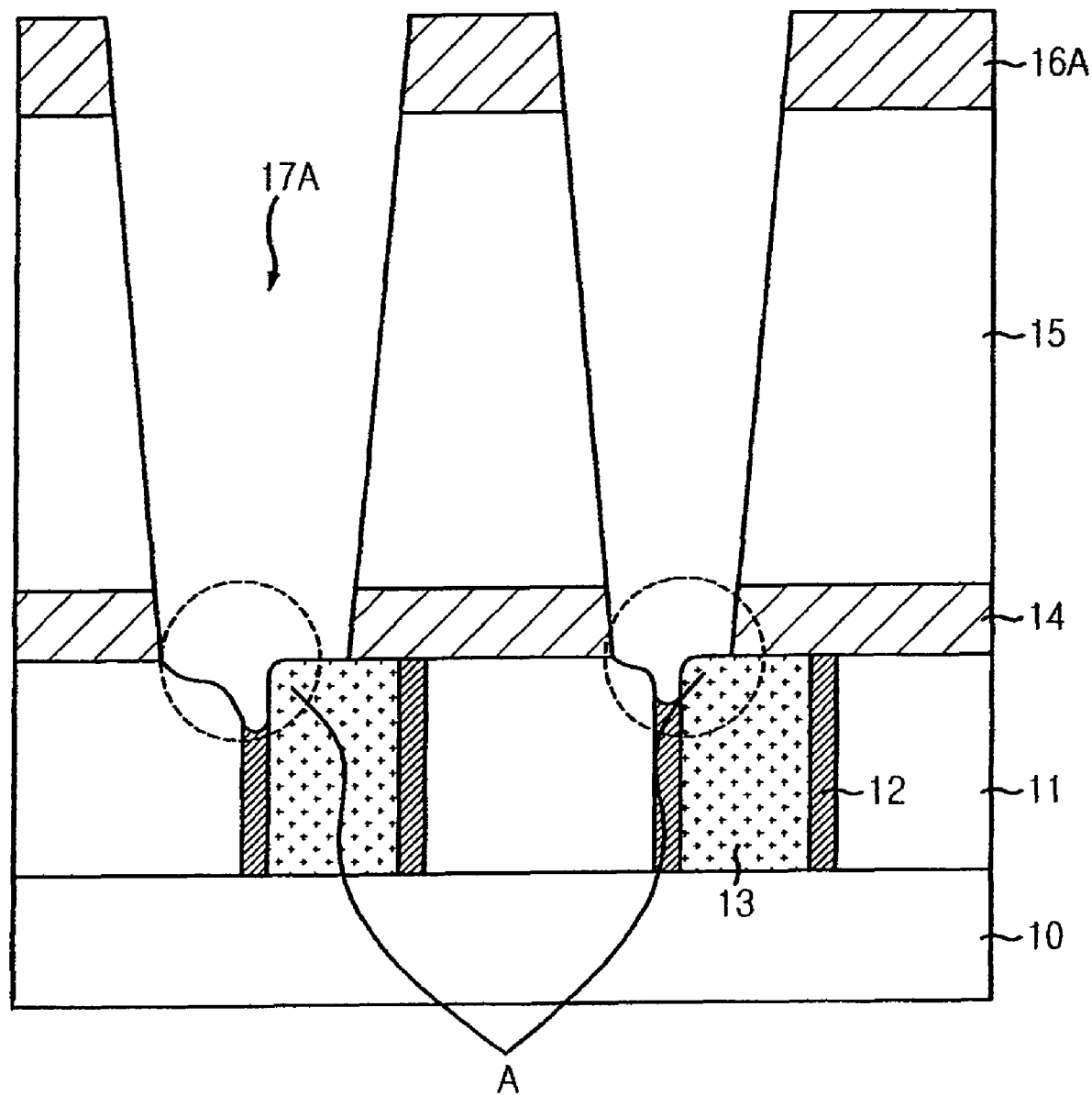
Figure 2A:
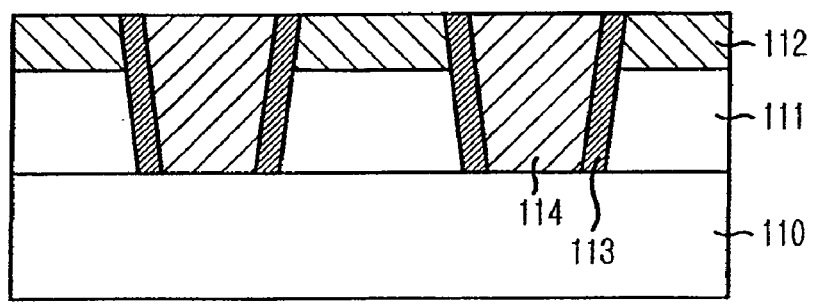
FIGS. 2A to 2E are cross-sectional views illustrating a method for forming a storage node of a capacitor in a semiconductor device in accordance with a first embodiment of the present invention.

Referring to FIG. 2A, a first inter-layer insulation layer 111 and a second inter-layer insulation layer 112 are sequentially formed on a semi-finished substrate 110. It should be appreciated that the first inter-layer insulation layer 111 and the second inter-layer insulation layer 112 have different etch rates. The first inter-layer insulation layer 111 and the second inter-layer insulation layer 112 are formed by using oxide and nitride, respectively. Although not illustrated, the semi-finished substrate 110 includes device isolation regions, word lines, and bit lines.

The first inter-layer insulation layer 111 and the second inter-layer insulation layer 112 are etched to form first contact holes (not shown) exposing predetermined portions of the semi-finished substrate 110. A spacer layer based on a material that has an etch rate identical to that of the second inter-layer insulation layer 112, for instance, nitride, is formed over the etched second inter-layer insulation layer 112 and the first contact holes, and then etched to form spacers 113 on sidewalls of the first contact holes.

Next, a polysilicon layer is formed over the above resulting substrate structure until the polysilicon layer is buried inside of the first contact holes and then, a planarization process is performed on the polysilicon layer, thereby forming a plurality of contact plugs 114. Herein, the contact plugs 114 act as a storage-node contact plug.

Figure 2B:
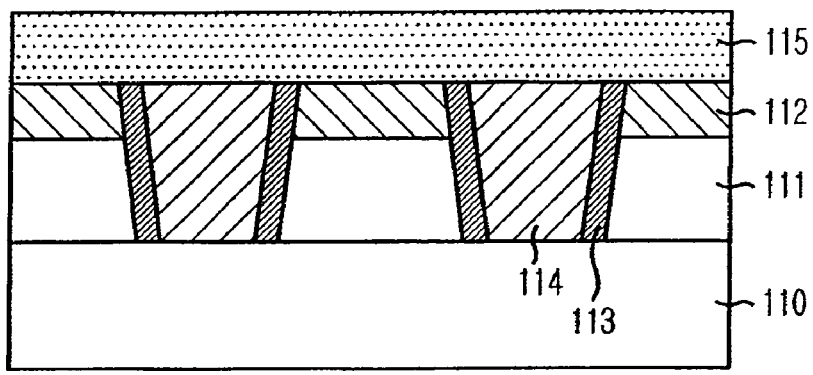

Referring to FIG. 2B, an etch stop layer 115 is formed over the contact plugs 114. The etch stop layer 115 controls an etch selectivity of a sacrificial oxide layer 116 (refer to FIG. 2C). The etch stop layer 115 may be formed by using a nitride layer obtained through employing a plasma enhanced chemical vapor deposition (PECVD) method or a low pressure chemical vapor deposition (LPCVD) method.

Figure 2C:
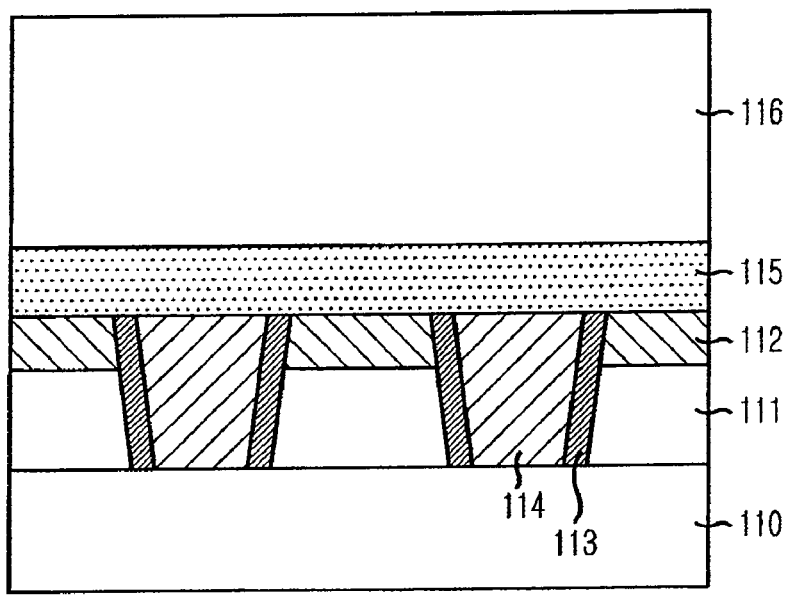

Referring to FIG. 2C, the aforementioned sacrificial oxide layer 116 is formed on the etch stop layer 115. It should be appreciated that the height of the sacrificial oxide layer 116 may determine the height of a capacitor. It is also possible to form the sacrificial oxide layer 116 in a stack structure including phosphosilicate glass (PSG) and tetraethylorthosilicate (TEOS).

Figure 2D:
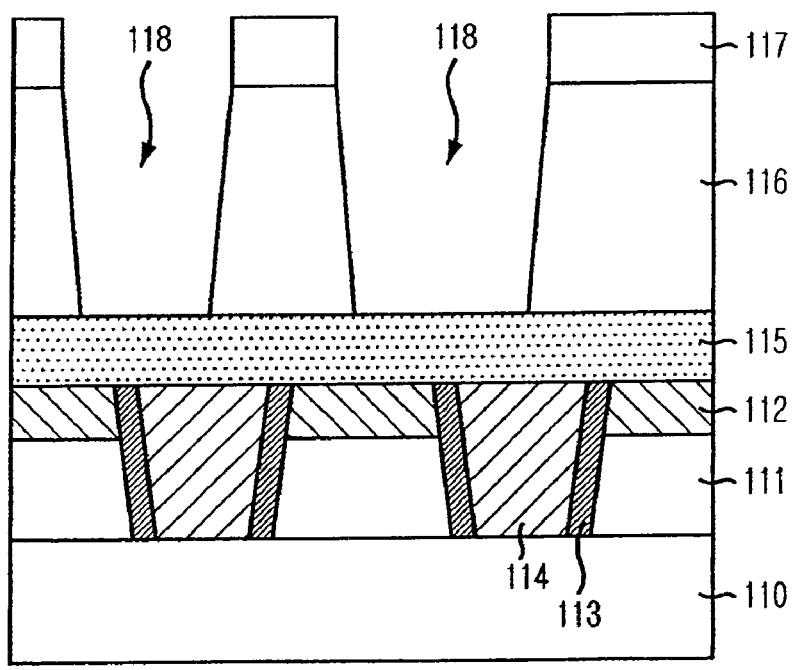

Referring to FIG. 2D, the sacrificial oxide layer 116 is etched by using a photoresist pattern 117 as an etch mask to form a plurality of second contact holes 118 on top of the etch stop layer 115, thereby opening regions where storage nodes will be formed. The second contact holes 118 acts as storage node contact holes.

Figure 2E:
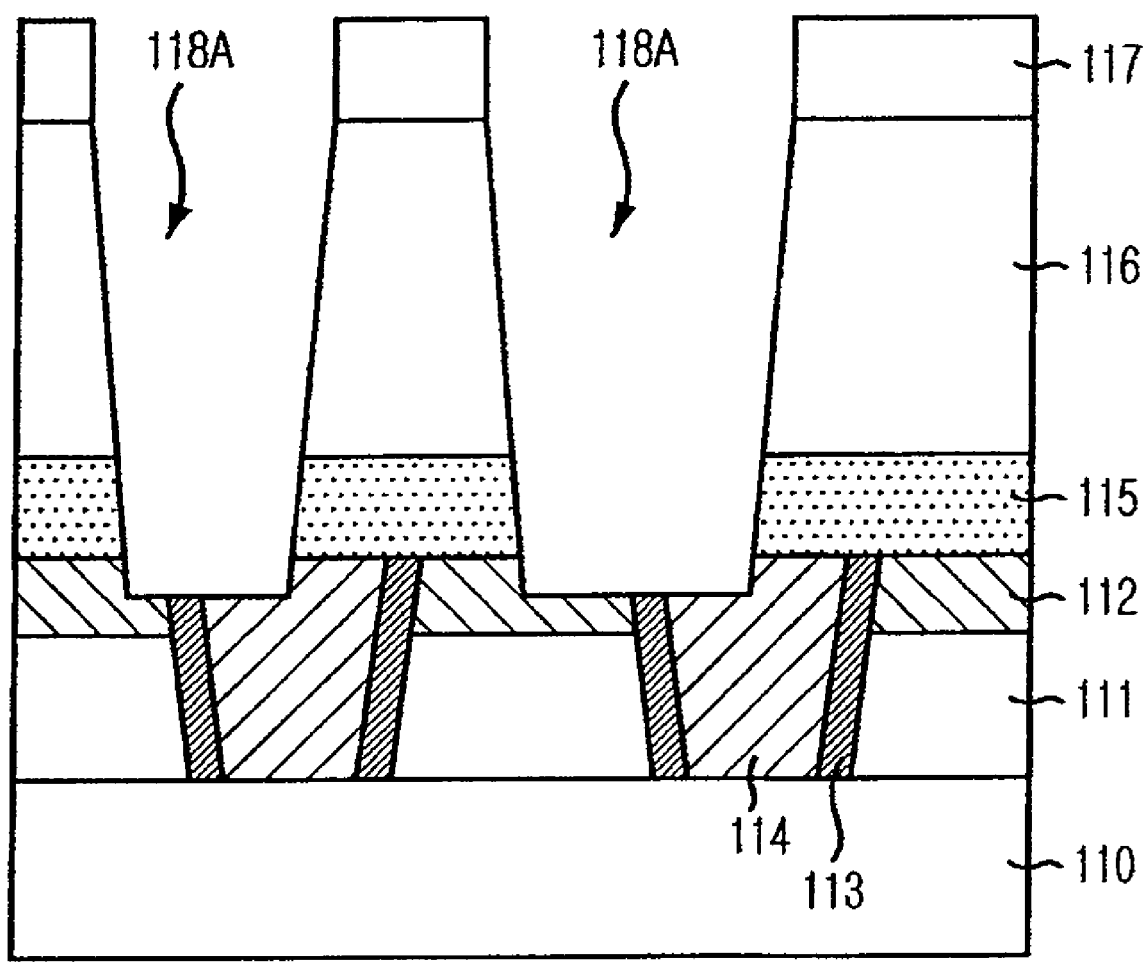

Referring to FIG. 2E, the etch stop layer 115 is then etched with use of the etched sacrificial oxide layer 116 as an etch mask, thereby forming a plurality of third contact holes 118A exposing the contact plugs 114. Since the second inter-layer insulation layer 112 is based on a material such as nitride that provides the same etch rate with the spacers 113, it is possible to prevent the spacers 113 from being over-etched. Therefore, the third contact holes 118A can be formed more stably and thus, a step-coverage characteristic of a storage node material, which will be subsequently formed, can be improved.

According to the first embodiment of the present invention, the insulation layer including the contact plugs is formed in a stack structure including the first inter-layer insulation layer and the second inter-layer insulation layer each having a different etch rate and, the sidewall spacers of the contact plugs are formed by using the same material that has the same etch rate with the second inter-layer insulation layer. As a result, it is possible to prevent the sidewall spacers from being over-etched during the formation of the second contact holes, i.e., the storage node contact holes. Accordingly, a typically observed incidence of the crevice generation in the spacers does not appear, thereby improving a step-coverage characteristic of the storage node material.

FIGS. 3A to 3G are cross-sectional views illustrating a method for forming a storage node of a capacitor in a semiconductor device in accordance with a second embodiment of the present invention.

Figure 3A:
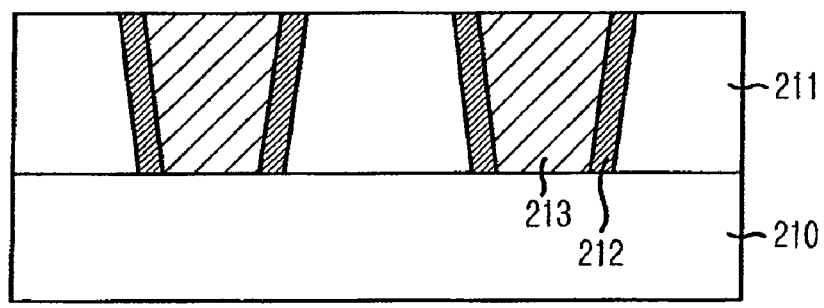
FIGS. 3A to 3G are cross-sectional views illustrating a method for forming a storage node of a capacitor in a semiconductor device in accordance with a second embodiment of the present invention.

Referring to FIG. 3A, a first inter-layer insulation layer 211 is formed on a semi-finished substrate 210 and then etched to form a plurality of first contact holes (not shown) exposing predetermined regions of the semi-finished substrate 210. Although not illustrated, the semi-fished substrate 210 includes device isolation regions, word lines and bit lines. The first inter-layer insulation layer 211 may comprise an oxide layer.

Next, a spacer layer based on a material that has a different etch rate from the first inter-layer insulation layer 211, for instance, nitride, is formed over the etched first inter-layer insulation layer 211 and the first contact holes. Then, the spacer layer is etched to form spacers 212 on sidewalls of the first contact holes.

Afterwards, a contact plug material is formed on an entire surface of the above resulting substrate structure until the first contact holes are filled with the contact plug material and then, a planarization process is performed on the contact plug material to form contact plugs 213. Herein, the contact plugs 213 are formed by using polysilicon and act as storage-node contact plugs.

Figure 3B:
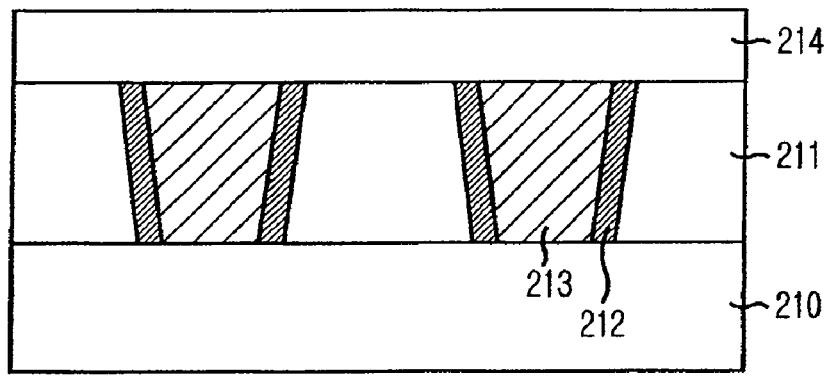

Referring to FIG. 3B, a second inter-layer insulation layer 214 is formed over the contact plugs 213 and the first inter-layer insulation layer 211. The second inter-layer insulation layer 214 is formed by using oxide.

Figure 3C:
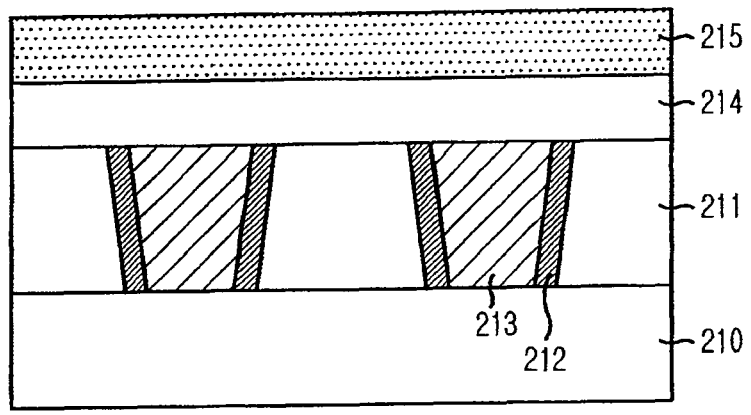

Referring to FIG. 3C, an etch stop layer 215 is formed on the second inter-layer insulation layer 214. The etch stop layer 215 is based on a material that has the same etch rate with the spacers 212. The etch stop layer 215 stops an etching process that is used to etch a sacrificial oxide layer 216 (refer to FIG. 3D), which is formed on top of the etch stop layer 215. This is done by selecting a material for an etch stop layer that is resistant to the etch process gas used to etch the sacrificial oxide layer 216. The etch stop layer 215 is formed by using a nitride layer obtained through employing a PECVD method or LPCVD method in the present implementation.

Figure 3D:
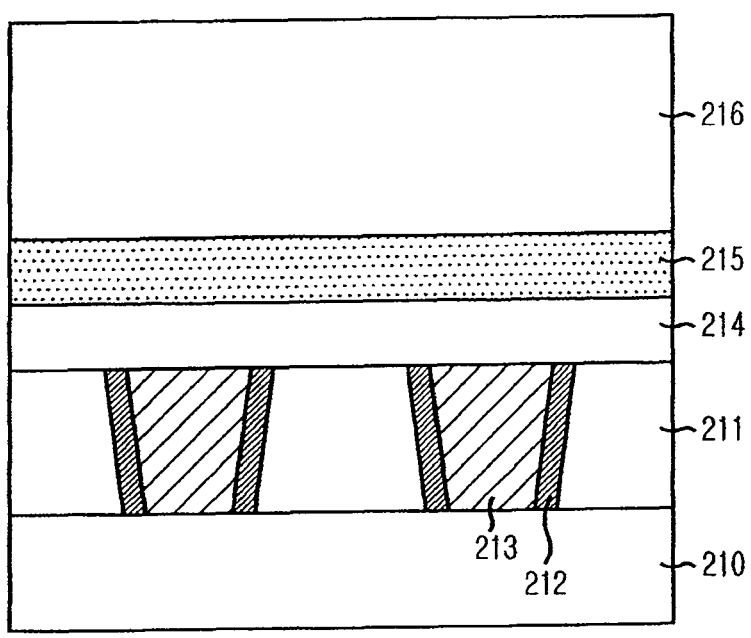

Referring to FIG. 3D, the aforementioned sacrificial oxide layer 216 is formed on the etch stop layer 215. It should be appreciated that the height of the sacrificial oxide layer 216 may determine the height of a capacitor. It is also possible to form the sacrificial oxide layer 216 in a stack structure including PSG and TEOS.

Figure 3E:
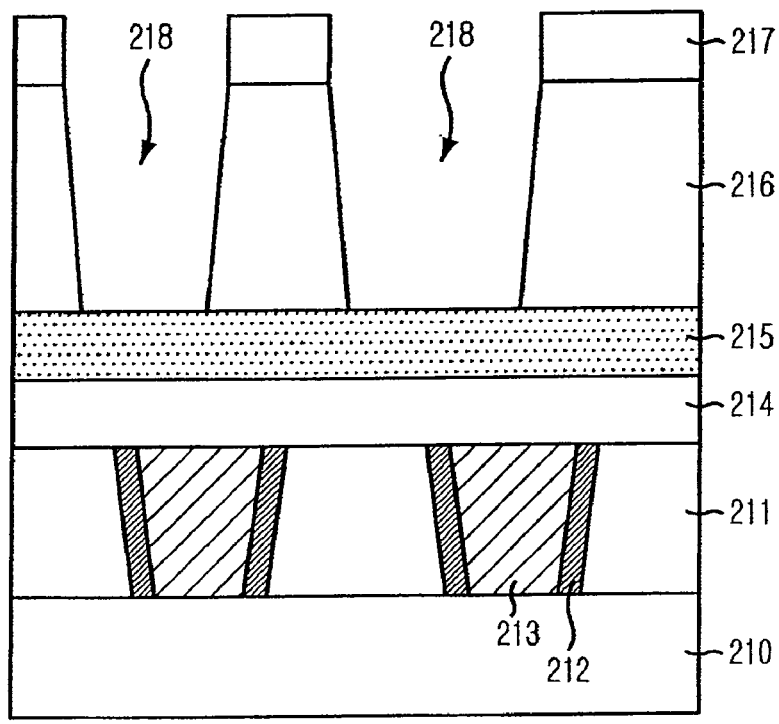

Referring to FIG. 3E, a photoresist pattern 217 is formed on the sacrificial oxide layer 216. The sacrificial oxide layer 216 is etched by using the photoresist pattern 217 as an etch mask, thereby forming a plurality of second contact holes 218 on top of the etch stop layer 215. The second contact holes 218 open regions where storage nodes will be formed.

Figure 3F:
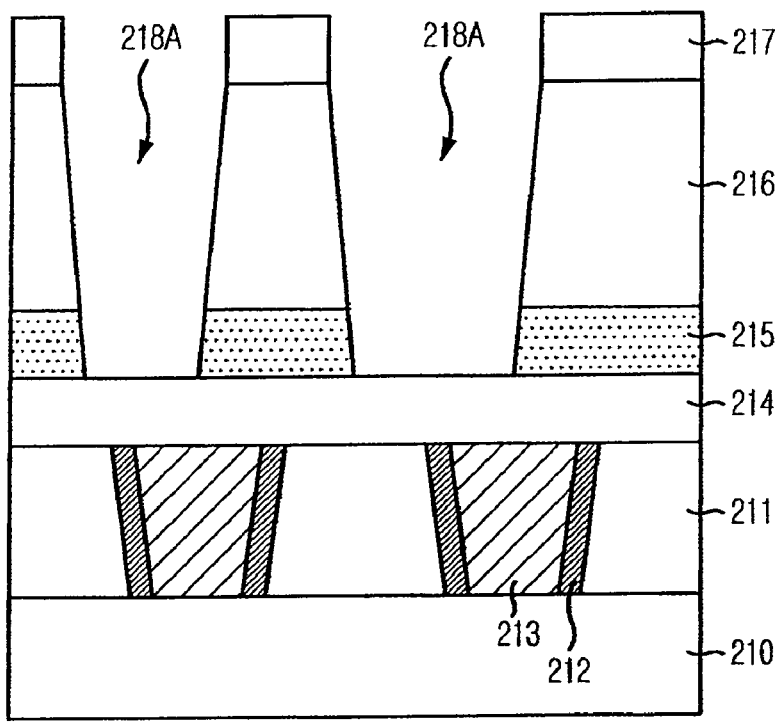

Referring to FIG. 3F, the etch stop layer 215 is etched by using the etched sacrificial oxide layer 216 as an etch mask to form a plurality of third contact holes 218A exposing portions of the second inter-layer insulation layer 214, where storage nodes will be formed.

Figure 3G:
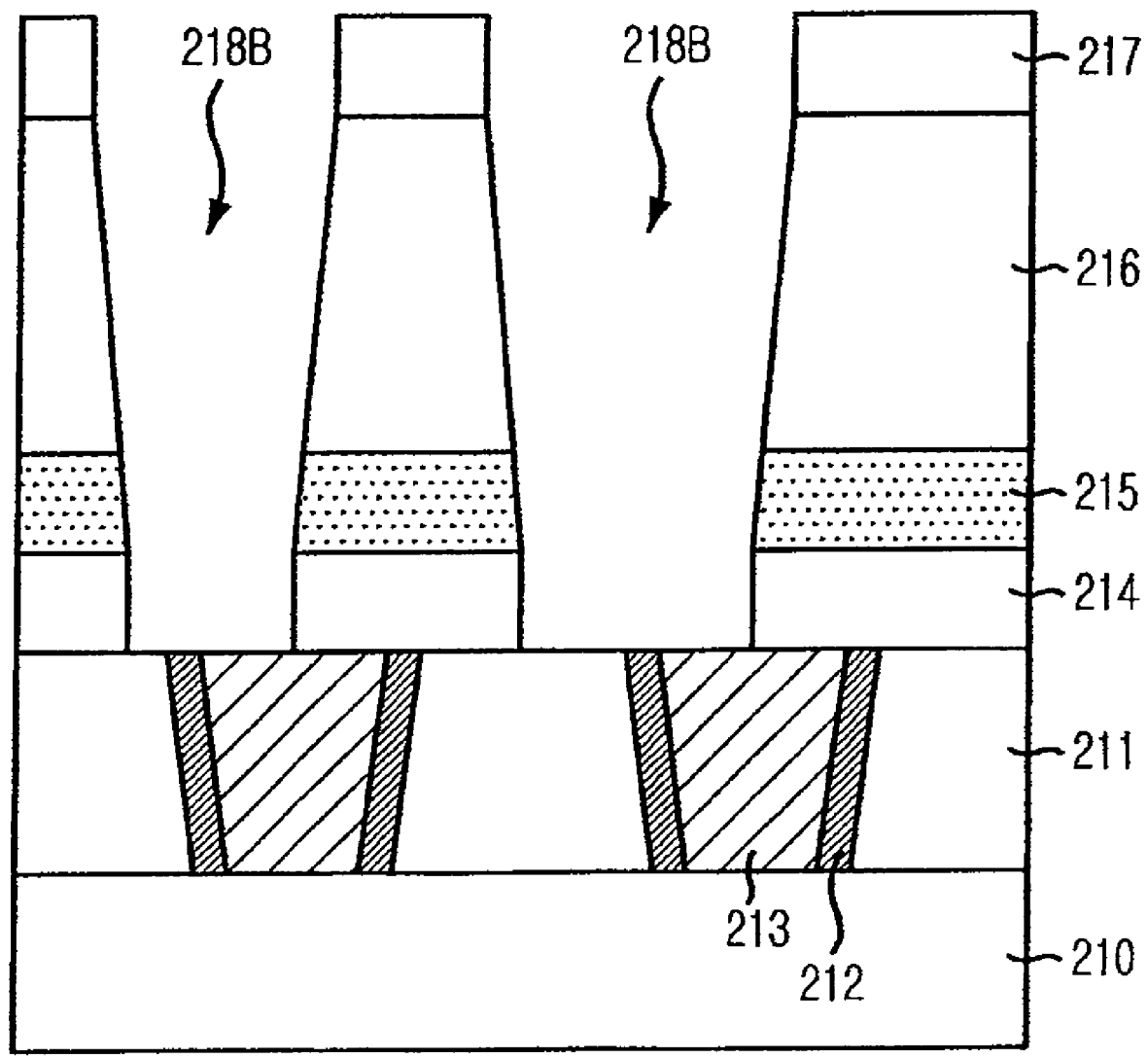

Referring to FIG. 3G, the second inter-layer insulation layer 214 is etched such that the contact plugs 213 are exposed for the purpose of connecting the storage nodes with the contact plugs 213. After the etching of the second inter-layer insulation layer 214, a plurality of fourth contact holes 218B are formed. The etching process for forming the fourth contact holes 218B is targeted to etch an oxide layer, and thus, it is possible to prevent the nitride-based spacers 212 from being over-etched. Hence, it is possible to form the fourth contact holes 218B more stably and as a result, it is possible to improve a step coverage characteristic of a storage node material, which will be formed subsequently.

According to the second embodiment of the present invention, the etching process for forming the contact holes for connecting the contact plugs with the storage nodes, i.e., the fourth contact holes, is applied to etch the oxide layer, which is the second inter-layer insulation layer. Hence, the sidewall spacers of the contact plugs are not subjected to an incidence of over-etching. Accordingly, crevices are not generated in the sidewall spacers during the formation of the fourth contact holes. As a result of this effect, a step-coverage characteristic of the storage node material can be improved.

FIGS. 4A to 4G are cross-sectional views illustrating a method for forming a storage node of a capacitor in a semiconductor device in accordance with a third embodiment of the present invention.

Figure 4A:
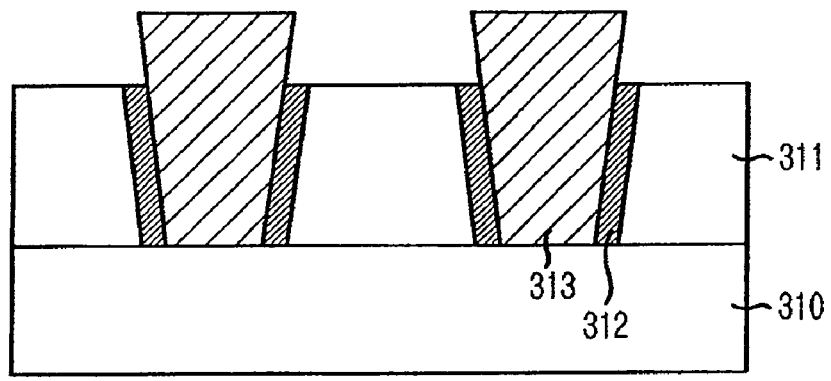
FIGS. 4A to 4G are cross-sectional views illustrating a method for forming a storage node of a capacitor in a semiconductor device in accordance with a third embodiment of the present invention.

Referring to FIG. 4A, a first inter-layer insulation layer 311 is formed on a semi-finished substrate 310 and then, etched to form a plurality of first contact holes (not shown) exposing predetermined portions of the semi-finished substrate 310. Although not illustrated, the semi-finished substrate 310 includes device isolation regions, word lines and bit lines. The first inter-layer insulation layer 311 is formed by using oxide.

Next, a spacer layer based on a material that has a different etch rate from the first inter-layer insulation layer 311 such as nitride is formed over the first contact holes and the first inter-layer insulation layer 311. Then, the spacer layer is etched to form spacers 312 on sidewalls of the first contact holes.

Afterwards, a contact plug material is formed on an entire surface of the above resulting substrate structure until the first contact holes are filled with the contact plug material and then, the contact plug material is etched to form a plurality of contact plugs 313 filled into the first contact holes. The etching process continues until the contact plugs 313 are protruded upwardly such that each of the contact plugs 313 has a height larger than that of the first inter-layer insulation layer 311. The contact plugs 313 are based on polysilicon and act as storage-node contact plugs.

Figure 4B:
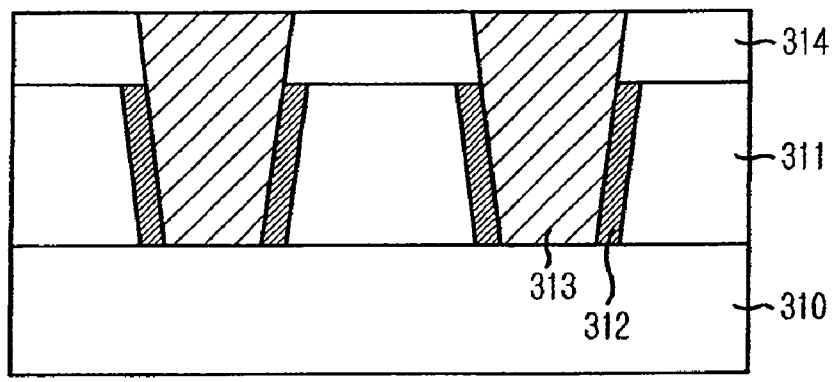

Referring to FIG. 4B, a second inter-layer insulation layer 314 is formed over the protruded contact plugs 313 and is then subjected to a chemical mechanical polishing (CMP) process for the purpose of planarizing the second inter-layer insulation layer 314. In particular, this planarization process continues until the second inter-layer insulation layer 314 reaches to the same surface level of the individual contact plug 313. The second inter-layer insulation layer 314 is an oxide layer.

Figure 4C:
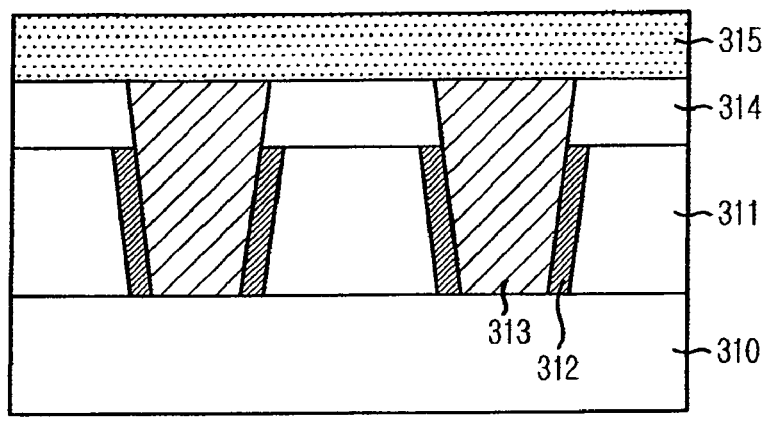

Referring to FIG. 4C, an etch stop layer 315 is formed over the second inter-layer insulation layer 314 and the contact plugs 313. Herein, the etch stop layer 315 serves a role in stopping an etching process for forming subsequent second contact holes for use in storage nodes. The formation of the second contact holes will be described in detail in FIG. 4E. The etch stop layer 315 stops the etching by controlling an etch selectivity of a sacrificial oxide layer, which will be formed subsequent to the formation of the etch stop layer 315. The formation of the sacrificial oxide layer will be described in detail in FIG. 4D. Etch stop layer 315 may be formed by using nitride through employing a PECVD method or a LPCVD method. Other methods may be used in other implementations.

Figure 4D:
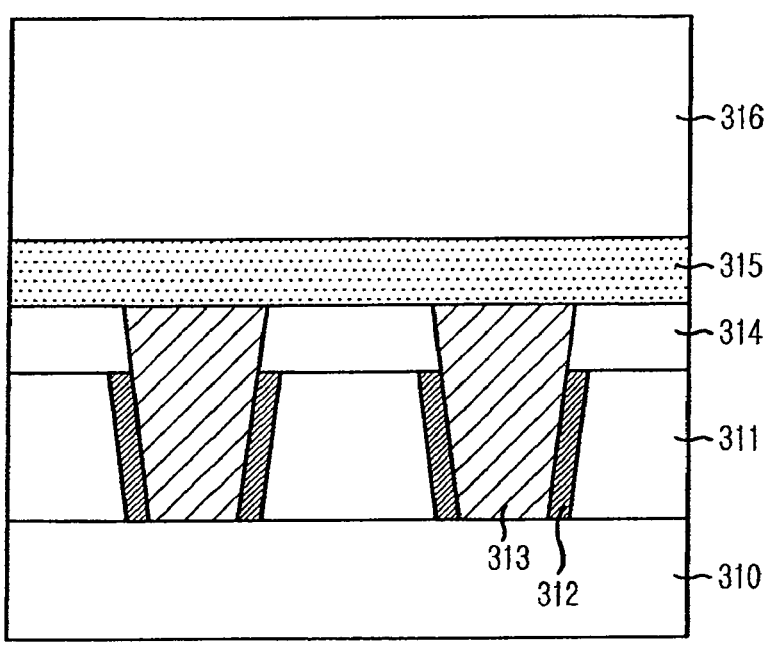

Referring to FIG. 4D, the aforementioned sacrificial oxide layer 316 is formed on the etch stop layer 315. The height of the sacrificial oxide layer 316 generally determines the height of a capacitor. Also, it may be possible to form the sacrificial oxide layer 316 in a stack structure including PSG and TEOS.

Figure 4E:
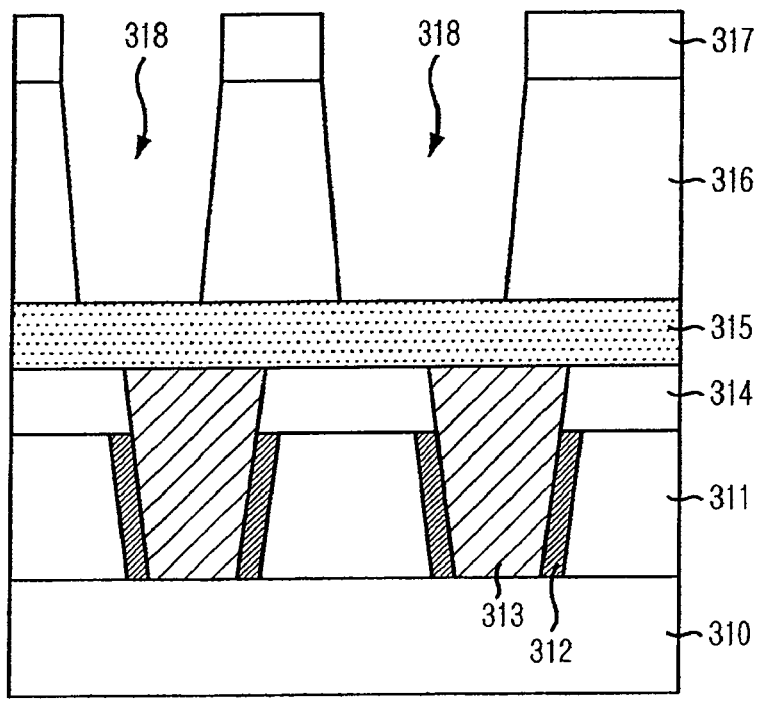

Referring to FIG. 4E, a predetermined photoresist pattern 317 is formed on the sacrificial oxide layer 316. The sacrificial oxide layer 316 is etched by using the photoresist pattern 317 as an etch mask, thereby forming the aforementioned second contact holes 318 on the etch stop layer 315. The second contact holes 318, i.e., the storage node contact holes, open regions where storage nodes will be formed.

Figure 4F:
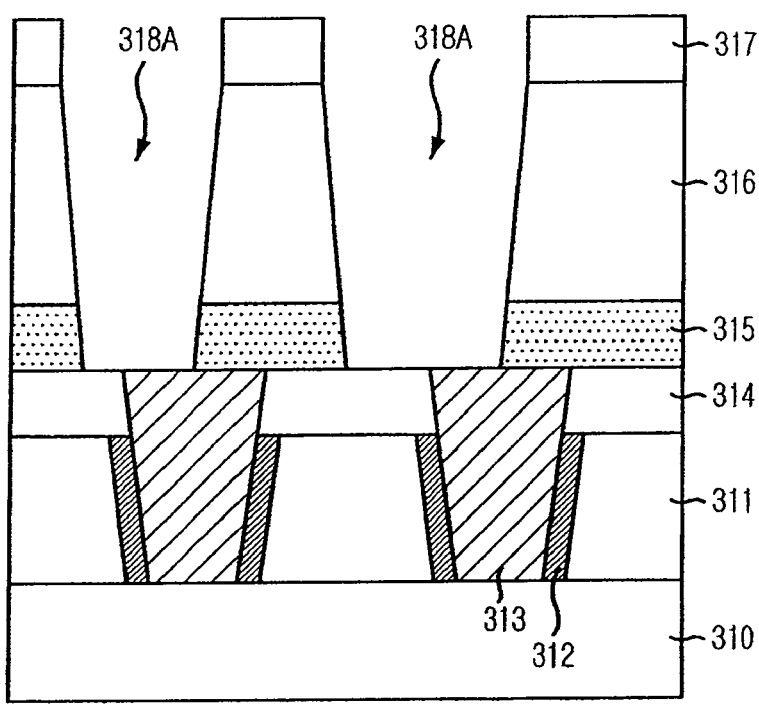

Referring to FIG. 4F, the etch stop layer 315 is etched by using the etched sacrificial oxide layer 316 as an etch mask, thereby forming a plurality of third contact holes 318A exposing the second inter-layer insulation layer 314 where the storage node regions are defined.

Figure 4G:
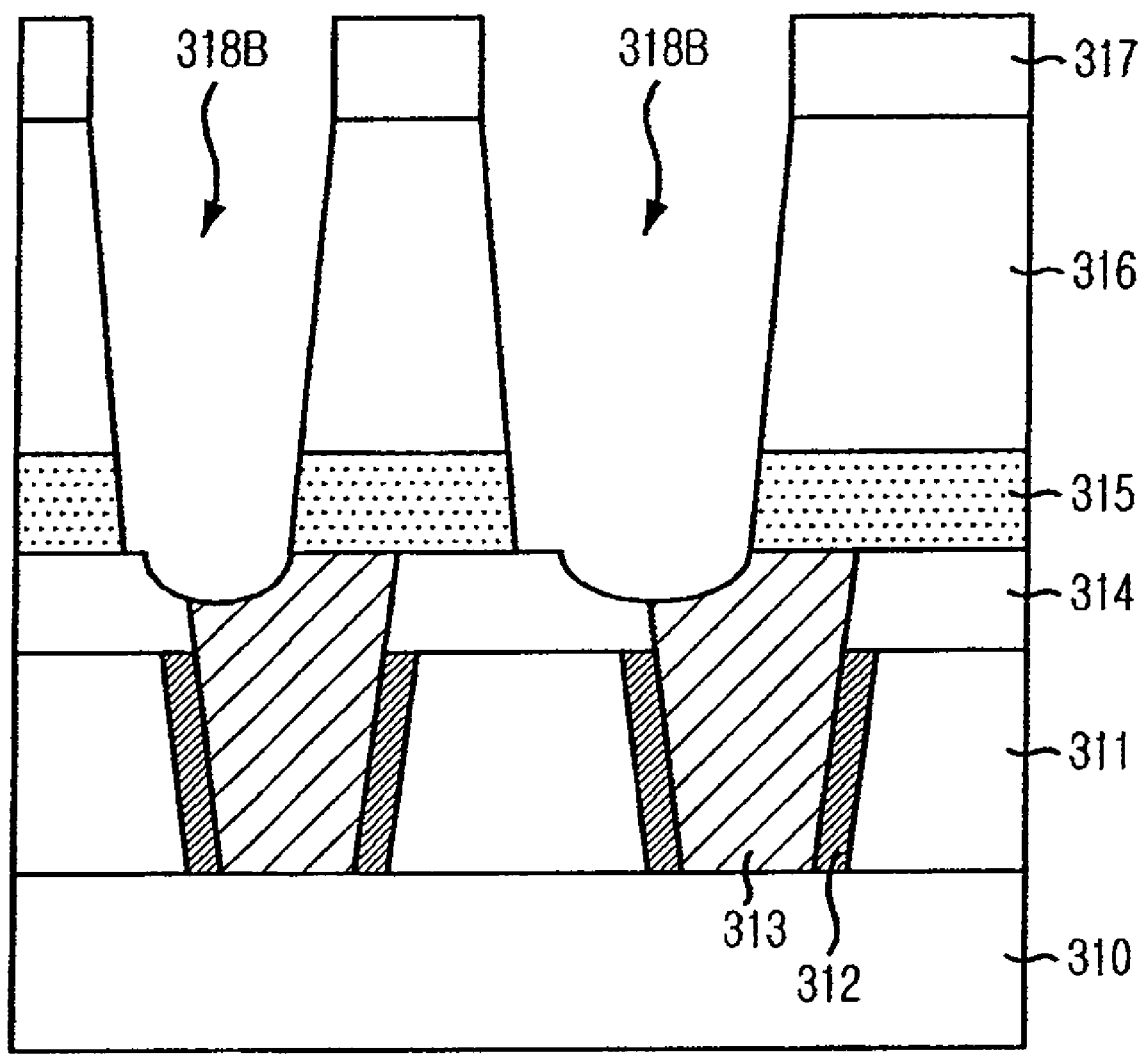

Referring to FIG. 4G, predetermined portions of the second inter-layer insulation layer 314 are etched to form a plurality of fourth contact holes 318B which expose the contact plugs 313 to provide an individual connection between the contact plugs 313 and the storage nodes. In accordance with an embodiment of the present invention, this etching process for forming the fourth contact holes 318B employs an isotropic etching by lowering an etch selectivity of nitride with respect to the contact plugs 313 formed of polysilicon. Hence, the isotropic etching process makes it possible to prevent the nitride-based spacers 312 from being over-etched. Accordingly, the fourth contact holes 318B can be stably formed, thereby improving a step-coverage characteristic of a storage node material, which will be formed subsequently.

According to the third embodiment of the present invention, the isotropic etching process is employed by lowering the etch selectivity of the nitride-based spacers with respect to the storage-node contact plugs during the formation of the contact holes for connecting the storage-node contact plugs with the storage nodes. As a result of the isotropic etching, the over-etching of the nitride-based spacers can be blocked. Hence, crevices are not generated in the spacers, thereby improving a step-coverage characteristic of the storage node material.

FIGS. 5A to 5D are cross-sectional views illustrating a method for forming a storage node of a capacitor in a semiconductor device in accordance with a fourth embodiment of the present invention.

Figure 5A:
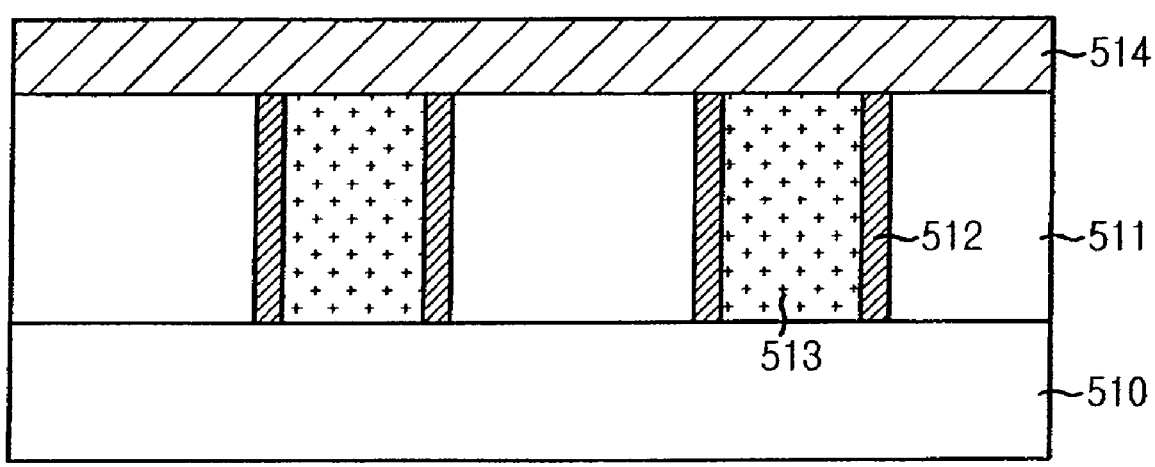
FIGS. 5A to 5D are cross-sectional views illustrating a method for forming a storage node of a capacitor in a semiconductor device in accordance with a fourth embodiment of the present invention.

Referring to FIG. 5A, an inter-layer insulation layer 511 is formed on a semi-finished substrate 510. Although not illustrated, the semi-finished substrate 510 includes word lines, bit lines, junction regions, cell contact plugs, an oxide-based insulation layer, and a nitride-based etch stop layer. Also, the inter-layer insulation layer 511 formed on the semi-finished substrate 510 is a single layer of an oxide-based material including high density plasma oxide, borophosphosilicate glass (BPSG), PSG, TEOS, undoped silicate glass (USG), fluorinated silicate glass (FSG), carbon doped oxide (CDO) and organosilicate glass (OSG).

The inter-layer insulation layer 511 is then subjected to a CMP process for the purpose of planarization. Although not illustrated, a nitride-based hard mask layer is formed on the inter-layer insulation layer 511 and then, patterned as a hard mask. With use of the hard mask, the inter-layer insulation layer 511 is etched to form a plurality of first contact holes (not shown) exposing the cell contact plugs, which are formed of polysilicon.

Afterwards, the nitride-based hard mask is removed and then, a first insulation layer 512 serving as a barrier layer is formed over the first contact holes. The first insulation layer 512 is an oxide-based layer including one of aluminum oxide ($Al_2O_3$), PE-TEOS oxide, ALD oxide, and tantalum oxide ($Ta_2O_5$), and has a thickness ranging from approximately 50 Å to approximately 500 Å. A storage-node contact plug material including one of polysilicon and tungsten fills the first contact holes and, a CMP process or an etch-back process is performed to form a plurality of storage-node contact plugs 513 buried into the first contact holes and the isolated first inter-layer insulation layer 512 at sidewalls of the first contact holes. The isolated first inter-layer insulation layer 512 serves as a spacer.

Subsequent to the formation of the storage-node contact plugs 513, a second insulation layer 514 is formed on an entire surface of the above resulting substrate structure. The second insulation layer 514 is formed by using a material that has a different etch characteristic (e.g., etch rate with respect to a given etch process) from the first insulation layer 512. More specifically, the second insulation layer is a nitride-based layer including one of PECVD nitride, ALD nitride, and low-pressure nitride, and has a thickness ranging from approximately 100 Å to approximately 1,000 Å.

Figure 5B:
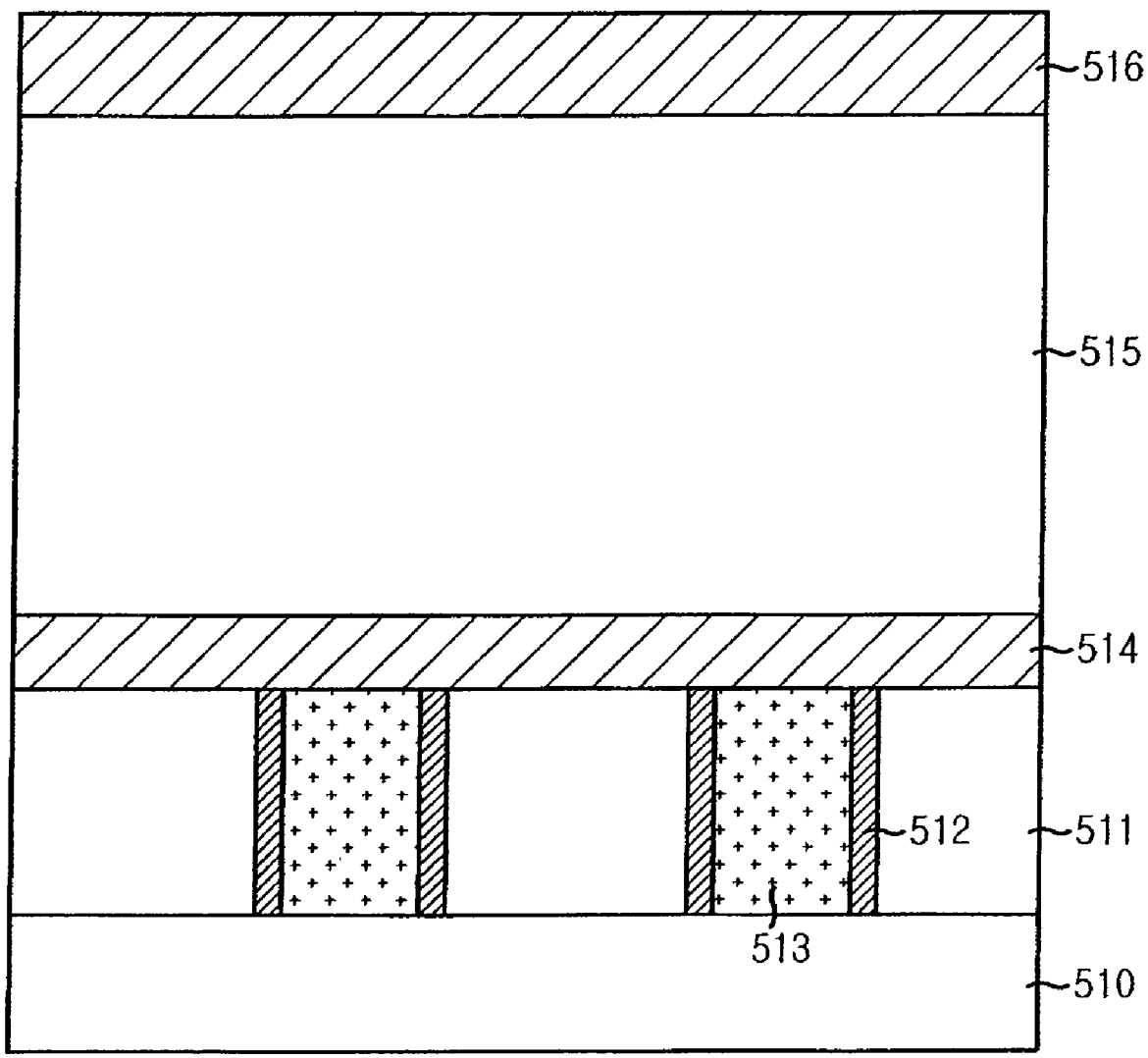

Referring to FIG. 5B, a third insulation layer 515 for use in a storage node pattern is formed on the second inter-layer insulation layer 514. The third inter-layer insulation layer 515 is formed in a single layer of the identical material for forming the inter-layer insulation layer 511 or stacked layers thereof. Examples of such material are PE-TEOS oxide, LP-TEOS oxide, PSG oxide, BPSG oxide, and ALD oxide.

On top of the third insulation layer 515, a hard mask layer 516 including polysilicon or nitride is formed. According to one embodiment of the present invention, the hard mask layer 516 can be formed in a single layer of a material selected from a group consisting of polysilicon, silicon nitride (SiN) and tungsten (W) or in stacked layers thereof. The hard mask layer 516 has a thickness ranging from approximately 500 Å to approximately 5,000 Å. The hard mask layer 516 is generally unnecessary when the total height of an intended storage node contact hole structure is less than approximately 15,000 Å.

Figure 5C:
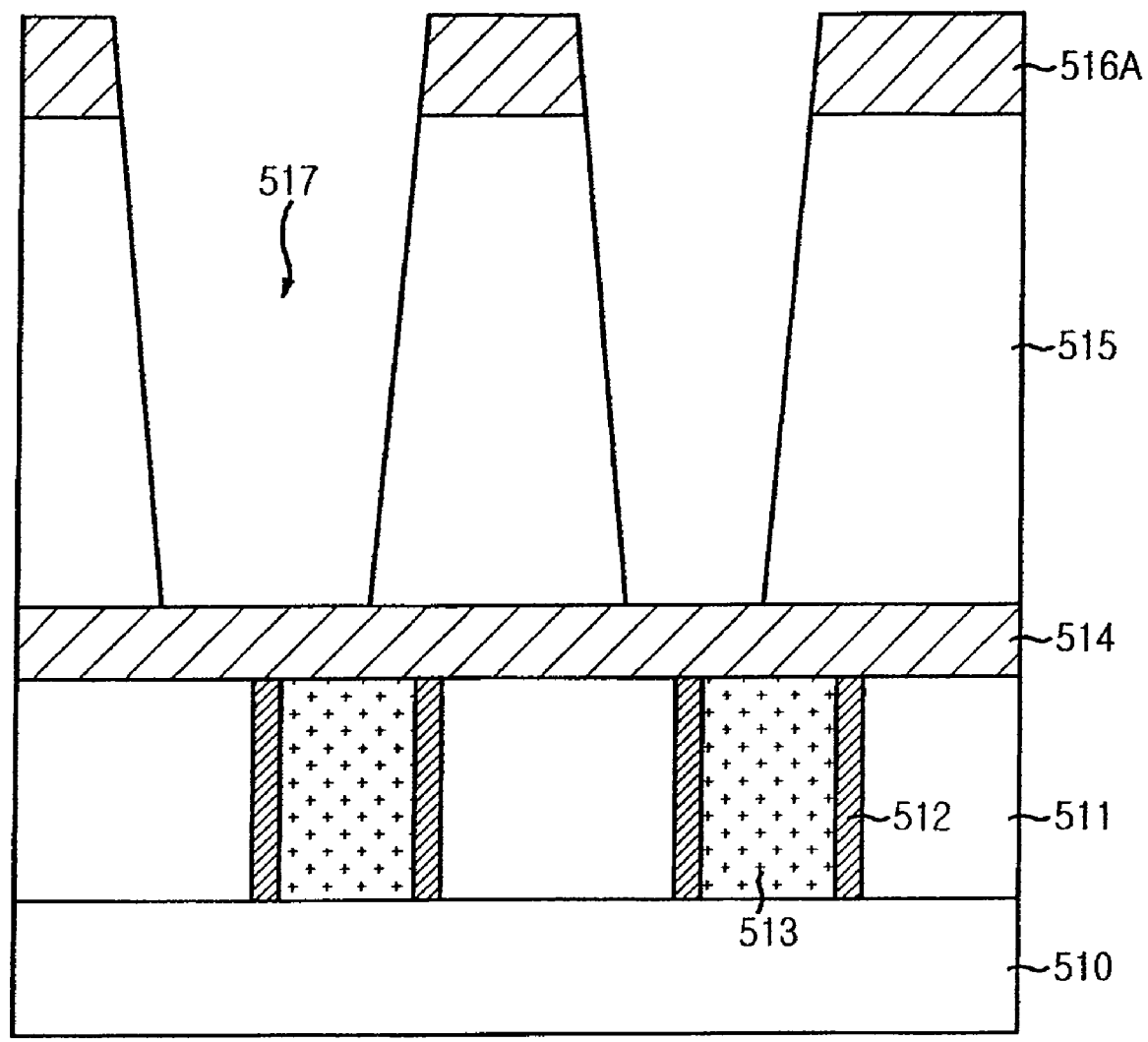

Referring to FIG. 5C, although not illustrated, a photoresist layer is formed on the hard mask layer 516 and then patterned through a photo-exposure and developing process with use of a mask, thereby forming a photoresist pattern. The hard mask layer 516 is then etched by using the photoresist pattern, thereby forming a hard mask pattern 516A. Afterwards, the photoresist pattern is removed through a strip process.

By using the hard mask pattern 516A as an etch mask, the third insulation layer 515 is etched to form a plurality of second contact holes 517 exposing the second insulation layer 514. The etching process for forming the second contact holes 517 employs a gas selected from a group consisting of $C_4F_6$, $C_5F_8$ and $C_3F_8$ as a main etch gas and another gas selected from a group consisting of Ar, He, Xe and $O_2$ as a supplementary gas. Other gas mixtures may be used in other implementations. Also, the second insulation layer 514 functions as an etch stop layer for the etching process for forming the second contact holes 517.

Figure 5D:
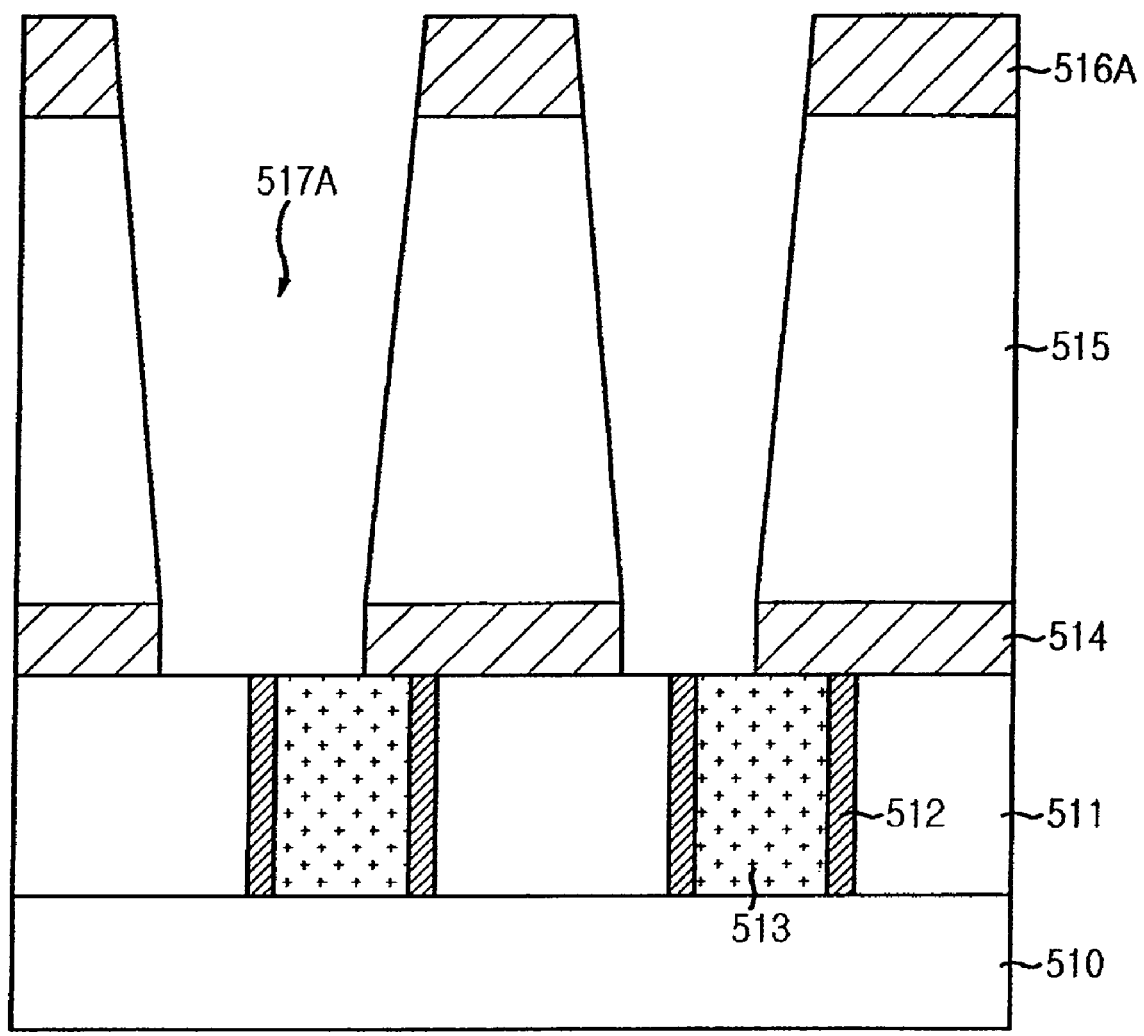

Referring to FIG. 5D, predetermined portions of the second insulation layer 514 exposed by the second contact holes 517 are etched under a specific condition of high etch selectivity between the second insulation layer 514 and the first insulation layer 512. The etching of the second insulation layer 514 uses $CHF_3$ gas as a main etch gas and another gas selected from a group consisting of $O_2$, Ar, $CF_4$ and a combination thereof as a supplementary gas. Other gas types may be used in other implementations. From this etching process, a plurality of third contact holes 517A exposing the storage-node contact plugs 513 are formed.

Although not illustrated, a storage node layer and a dielectric layer are sequentially formed over the third contact holes 517A and then, an upper electrode layer is formed on the dielectric layer such that the upper electrode layer fills the third contact holes 517A. A CMP process is performed thereon, thereby forming capacitors.

Figure 6A:
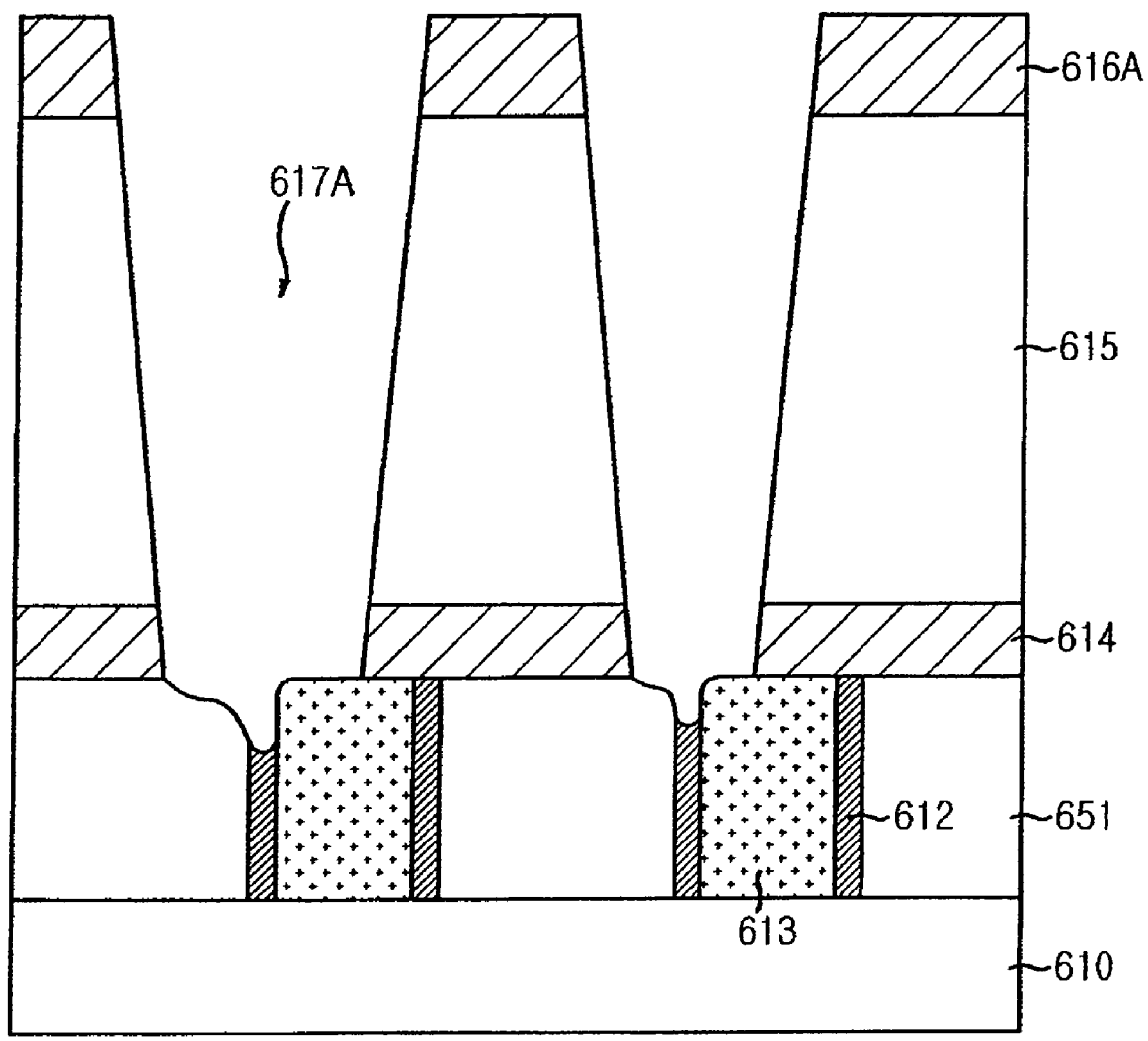
FIGS. 6A to 6B are cross-sectional views illustrating a method for forming a storage node of a capacitor in a semiconductor device in accordance with a fifth embodiment of the present invention.
Figure 6B:
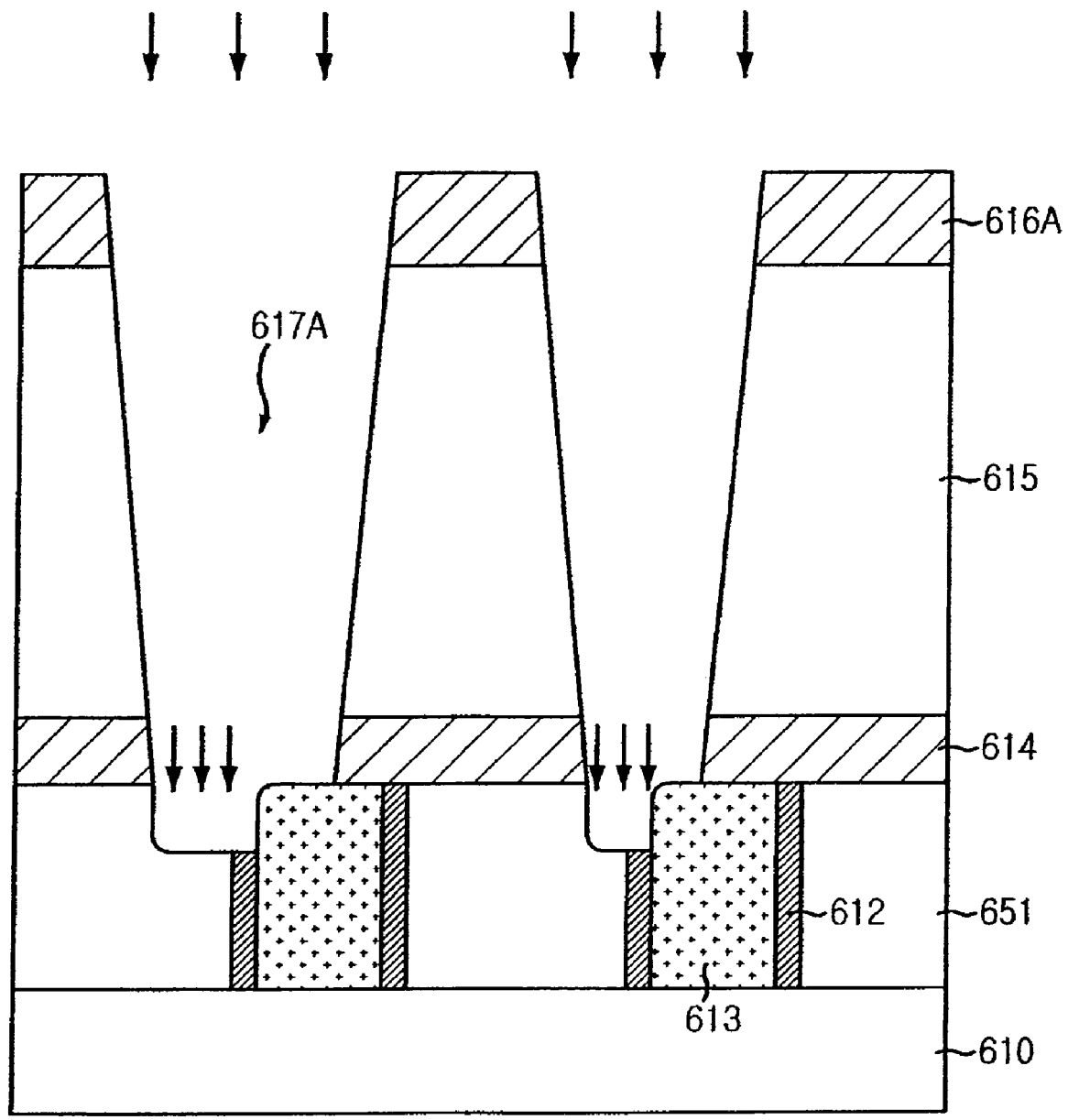

FIGS. 6A and 6B are cross-sectional views illustrating a method for forming a storage node of a capacitor in a semiconductor device in accordance with a fifth embodiment of the present invention.

Referring to FIG. 6A, an inter-layer insulation layer 611 is formed on a semi-fished substrate 610. Although not illustrated, the semi-finished substrate 610 includes word lines, bit lines, junction regions, cell contact plugs, an oxide-based insulation layer, and a nitride-based etch stop layer. The inter-layer insulation layer 611 is a single layer of an oxide-based material selected from a group consisting of HDP oxide, BPSG, PSG, TEOS, USG, FSG, CDO and OSG.

The inter-layer insulation layer 611 is then planarized through a CMP process. Then, although not illustrated, a nitride-based hard mask obtained through employing a photolithography process is formed on the inter-layer insulation layer 611. The inter-layer insulation layer 611 is then etched by using the hard mask as an etch mask, thereby forming a plurality of first contact holes (not shown) exposing the cell contact plugs (not shown).

The hard mask is then removed, and a spacer layer 612 is formed over the first contact holes. The spacer layer 612 serving as a barrier layer is formed by using nitride. Afterwards, a storage-node contact plug material such as polysilicon or tungsten is filled into the first contact holes. This storage-node contact plug material is then subjected to a CMP process or an etch-back process to form a plurality of storage-node contact plugs 613 filled into the first contact holes (not shown).

After the formation of the storage-node contact plugs 613, a nitride layer 614 is formed on an entire surface of the above resulting substrate structure. An insulation layer 615 for use in a storage node pattern is formed on the nitride layer 614. At this time, the insulation layer 615 is formed in a single layer or in stacked layers by using the same material used for forming the inter-layer insulation layer 611.

Subsequently, a hard mask pattern 616A is formed on the insulation layer 615. Although not illustrated, the hard mask pattern 616A is obtained through performing a photolithography process on a hard mask layer formed on the insulation layer 615. The insulation layer 615 is then etched by using the hard mask pattern 616A as an etch mask and the nitride layer 614 as an etch stop layer. The nitride layer 614 is etched to form a plurality of second contact holes 617A exposing the storage-node contact plugs 613.

Referring to FIG. 6B, another etching process is carried out under the target of selectively recessing predetermined portions of the inter-layer insulation layer 611 exposed by the second contact holes 617A. According to one embodiment of the present invention, this other etching process is carried out by employing a high density plasma under a recipe that allows the planarized nitride-based spacer layer 612, i.e., the spacers, not to be etched but the oxide-based inter-layer insulation layer 611 to be selectively etched. For instance, the high density plasma etching process is carried out to produce lots of polymers by using a mixed gas of $C_4F_6/C_3F_8/O_2/Ar$. The $C_4F_6$ gas, the $C_3F_8$ gas, the $O_2$ gas, and the Ar gas are mixed preferably in a ratio of 29 to 14 to 26 to 400, respectively. Other gas mixtures may be used in other implementations. Also, when it is assumed that a ratio of the Ar gas is approximately 100%, each of the rest of the gases including the $C_4F_6$ gas, the $C_3F_8$ gas, and the $O_2$ gas has a ratio set at approximately 4% to approximately 10%. Also, the high density plasma etching process is carried out by supplying a source power ranging from approximately 1,000 W to approximately 2,000 W, more preferably, approximately 1,500 W and a bias power ranging from approximately 1,500 W to approximately 2,600 W, more preferably, 2,100 W. A chamber pressure of the high density plasma etching apparatus ranges from approximately 15 mtorr to approximately 20 mtorr, more preferably, approximately 17 mtorr. Other chamber pressures may be used in other implementations. Under this etch recipe, a portion of the inter-layer insulation layer 611 can be selectively recessed while minimizing the loss of the nitride-based spacer layer 612, i.e., the spacers. The high density plasma etching process can be performed in-situ along with the etching process for forming the second contact holes 617A.

In addition, this other etching process can be carried out by using high density plasma using a mixed gas of $C_2F_6/O_2$. Particularly, when it is assumed that a mixing ratio of the $C_2F_6$ gas is approximately 100 sccm, the $O_2$ gas is mixed in a ratio ranging from approximately 1 sccm to approximately 4 sccm. The high density plasma etching process is carried out at a pressure ranging from approximately 1 mtorr to approximately 10 mtorr along with supplying approximately 300 W to approximately 500 W of source power and approximately 200 W to approximately 400 W of bias power.

Although not illustrated, a storage node layer and a dielectric layer are sequentially formed over the second contact holes 617A and then, an upper electrode layer is formed on the dielectric layer such that the upper electrode layer fills the second contact holes 617A. A CMP process is performed thereon, thereby forming capacitors.

According to the first to the fifth embodiments of the present invention, there are several approaches to prevent creation of crevices in the spacers caused by over-etching of the spacers.

First, the insulation layer including the storage-node contact plugs is formed in a stack structure of the first inter-layer insulation layer and the second inter-layer insulation layer each having a different etch rate and, spacers on sidewalls of the storage-node contact plugs are formed by using a material that has the same etch rate of the second inter-layer insulation layer. Hence, it is possible to prevent the spacers from being over-etched during a subsequent process of forming the storage node contact holes.

Second, the etching process for forming the storage node contact holes for connecting the storage-node contact plugs with the storage nodes is carried out under a specific recipe that gives a specific etch selectivity with respect to oxide. Therefore, it is possible to prevent the nitride-based spacers from being over-etched.

Third, the etching process for forming the storage node contact holes is carried out by employing an isotropic etching process through lowering an etch selectivity of nitride, i.e., the spacers with respect to the storage-node contact plugs. On the basis of the isotropic etching, it is possible to prevent the spacers from being over-etched.

Fourth, for the storage node formation, the spacers serving as a barrier layer for the storage-node contact plugs are formed by using a material that gives a different etch selectivity from the insulation layer being formed over the spacers and the storage-node contact plugs and serving as an etch stop layer. By using the different materials for the spacers and the insulation layer, it is possible to prevent the spacers from being simultaneously etched with the insulation layer during forming the storage nodes.

Last, as for the storage node formation, the insulation layer is formed on sidewalls of the spacers serving as a barrier layer for the storage-node contact plugs and then recessed in a predetermined depth under a specific etch recipe. Through this specific etch recipe, it is possible to improve a step-coverage characteristic of the storage node material.

As mentioned above, this effect of preventing the crevice generation in the spacers further results in an improvement on the step-coverage characteristic of the storage node material. Accordingly, it is possible to prevent degradation of device characteristics. Especially, it is possible to decrease leakage current of the capacitors, thereby minimizing defects in semiconductor devices. The minimized defect generation further results in high yields of semiconductor devices.

The present application contains subject matter related to the Korean patent application nos. KR 2004-0108694, KR 2004-0110083 and KR 2004-0112821, filed in the Korean Patent Office on Dec. 20, 2004, on Dec. 22, 2004, and on Dec. 27, 2004, respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for forming a capacitor in a semiconductor device, the method comprising:
    forming a first insulation layer over a substrate;
    forming a plurality of first contact holes extending through the first insulation layer;
    forming spacers on sidewalls of the first contact holes;
    filling storage-node contact plugs into the first contact holes;
    forming a second insulation layer over the storage-node contact plugs, wherein the second insulation layer has the same etch characteristics as the first insulation layer;
    forming an etch stop layer over the storage-node contact plugs;
    forming a sacrificial oxide layer over the etch stop layer;
    etching the sacrificial oxide layer and the etch stop layer to form a plurality of second contact holes exposing the storage-node contact holes; and
    forming a storage node in each of the second contact holes.

2. The method of claim 1, wherein the first insulation layer comprises oxide.

3. The method of claim 1, wherein the spacers comprise nitride.

4. The method of claim 1, wherein the spacers have a different etch characteristic from that of the first insulation layer.

5. The method of claim 1, wherein the etch stop layer has the same etch characteristic as the spacers.

6. The method of claim 1, wherein the height of the storage-node contact plugs is higher than the height of the first insulation layer.

7. The method of claim 1, wherein the sacrificial oxide layer is formed to have a stack structure including phosphosilicate glass (PSG) and tetraethylorthosilicate (TEOS).

8. The method of claim 1, further comprising:
    planarizing the second insulation layer to be at the same level as the storage-node contact plugs.

9. The method of claim 1, wherein etching the sacrificial layer and the etch stop layer comprises:
    sequentially etching the sacrificial oxide layer and the etch stop layer using an oxide etching process.

10. The method of claim 1, wherein etching the sacrificial layer and the etch stop layer comprises:
    performing an etching process that provides a low etch selectivity of the spacers with respect to the storage-node contact plugs.

11. A method for forming a capacitor in a semiconductor device, the method comprising:
    forming a first insulation layer over a substrate;
    forming a second insulation layer over the first insulation layer, wherein the second insulation layer and the first insulation layer have a different etch characteristic;
    forming a plurality of first contact holes extending through the first insulation layer;
    forming spacers on sidewalls of the first contact holes;
    filling storage-node contact plugs into the first contact holes;
    forming an etch stop layer over the storage-node contact plugs;
    forming a sacrificial oxide layer over the etch stop layer;
    etching the sacrificial oxide layer and the etch stop layer to form a plurality of second contact holes exposing the storage-node contact holes; and
    forming a storage node in each of the second contact holes.

12. The method of claim 11, wherein forming the first contact holes further comprises forming the first contact holes to extend through the first and the second insulation layers.

13. The method of claim 11, wherein the spacers have the same etch characteristic as the second insulation layer.

14. The method of claim 11, wherein the etch stop layer has the same etch characteristic as the second insulation layer.

15. The method of claim 11, wherein the second insulation layer comprises nitride.

16. The method of claim 1, further comprising:
    selectively recessing predetermined portions of the first insulation layer exposed through the second contact holes by using a different etch selectivity between the first insulation layer and the spacers.

17. The method of claim 16, wherein the first insulation layer comprises oxide and the spacers comprise nitride, the predetermined portions of the first insulation layer being recessed by performing a high density plasma method using a mixed gas of $C_4F_6/C_3F_8/O_2/Ar$.

18. The method of claim 17, wherein the mixed gas of $C_4F_6/C_3F_8/O_2/Ar$ comprises a ratio of the Ar gas set at approximately 100%, wherein each of the remaining gases has a ratio set at approximately 4% to approximately 10%.

19. The method of claim 17, wherein the high density plasma method is performed by applying approximately 1,000 W to approximately 2,000 W of source power and approximately 1,500 W to approximately 2,600 W of bias power under a pressure ranging from approximately 15 mtorr to approximately 20 mtorr.

20. The method of claim 16, wherein selectively recessing the predetermined portions of the first insulation layer employs a high density plasma method using a mixed gas of $C_2F_6/O_2$.

21. The method of claim 17, wherein in the mixed gas of $C_2F_6/O_2$, the $C_2F_6$ gas has a ratio of a flow amount set at approximately 100 sccm and the $O_2$ gas has a ratio of a flow amount ranging from approximately 1 sccm to approximately 4 sccm.

22. The method of claim 17, wherein the high density plasma method is performed by applying approximately 300 W to approximately 500 W of source power and approximately 200 W to approximately 400 W of bias power under a pressure ranging from approximately 1 mtorr to approximately 10 mtorr.

* * * * *